US011469732B2

(12) United States Patent
Perahia et al.

(10) Patent No.: US 11,469,732 B2
(45) Date of Patent: Oct. 11, 2022

(54) METHOD OF FABRICATING A SIC RESONATOR

(71) Applicant: HRL Laboratories, LLC, Malibu, CA (US)

(72) Inventors: Raviv Perahia, Malibu, CA (US); Logan D. Sorenson, Malibu, CA (US); Lian X. Huang, Malibu, CA (US); David T. Chang, Calabasas, CA (US); Makena S. White, Malibu, CA (US); Jeremy Bregman, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 570 days.

(21) Appl. No.: 16/368,737

(22) Filed: Mar. 28, 2019

(65) Prior Publication Data

US 2019/0305744 A1    Oct. 3, 2019

Related U.S. Application Data

(60) Provisional application No. 62/656,713, filed on Apr. 12, 2018, provisional application No. 62/651,046, (Continued)

(51) Int. Cl.
*H03H 3/02* (2006.01)
*H03H 9/205* (2006.01)
(Continued)

(52) U.S. Cl.
CPC .......... *H03H 3/02* (2013.01); *H03H 9/02031* (2013.01); *H03H 9/02228* (2013.01);
(Continued)

(58) Field of Classification Search
CPC .. H03H 3/02; H03H 9/02031; H03H 9/02228; H03H 9/0519; H03H 9/132;
(Continued)

(56) References Cited

U.S. PATENT DOCUMENTS 6,909,221 B2    6/2005   Ayazi
7,791,432 B2    9/2010   Piazza
(Continued)

OTHER PUBLICATIONS

U.S. Appl. No. 16/368,802, Perahia, Mar. 28, 2019.
(Continued)

*Primary Examiner* — Peter Dungba Vo
*Assistant Examiner* — Azm A Parvez
(74) *Attorney, Agent, or Firm* — Ladas & Parry, LLP

(57) ABSTRACT

A method of making a SiC resonator includes forming a layer of an oxide material on a relatively thick wafer of SiC; bonding the layer of oxide material on the relatively thick wafer of SiC to a handle wafer having at least an oxide exterior surface, the resulting bond being substantially free of voids; planarizing the relatively thick wafer of SiC to a desired thickness; forming top and bottom electrodes on the wafer of SiC wafer to define a SiC wafer resonator portion; and forming a trench around the top and bottom electrodes, the tench completely penetrating the planarized wafer of SiC around a majority of a distance surrounding said top and bottom electrodes, except for one or more tether regions of the planarized wafer of SiC which remain physically coupled a remaining portion the SiC wafer resonator portion which defines a frame formed of the planarized wafer of SiC surrounding the SiC wafer resonator portion.

19 Claims, 4 Drawing Sheets

10. Pattern Ni hard mask and etch SiC resonator 128

11. Remove Ni hard mask and HF release

Related U.S. Application Data filed on Mar. 30, 2018, provisional application No. 62/651,052, filed on Mar. 30, 2018.

(51) Int. Cl.

| | |
|---|---|
| *H03H 9/02* | (2006.01) |
| *H03H 9/05* | (2006.01) |
| *H03H 9/13* | (2006.01) |
| *H03H 9/17* | (2006.01) |
| *H03H 9/15* | (2006.01) |

(52) U.S. Cl.
CPC .......... *H03H 9/0519* (2013.01); *H03H 9/132* (2013.01); *H03H 9/176* (2013.01); *H03H 9/205* (2013.01); *H03H 2003/027* (2013.01); *H03H 2009/155* (2013.01)

(58) Field of Classification Search
CPC .. H03H 9/176; H03H 9/205; H03H 2003/027; H03H 2009/155
USPC ..................... 29/25.35, 592.1, 825
See application file for complete search history.

(56) References Cited

U.S. PATENT DOCUMENTS

| | | |
|---|---|---|
| 8,769,802 B1 | 7/2014 | Chang |
| 10,281,277 B1 | 5/2019 | Perahia |
| 10,676,349 B1* | 6/2020 | Grosjean ............. H03H 9/2452 |
| 2008/0246559 A1 | 10/2008 | Ayazi |
| 2012/0274184 A1 | 11/2012 | Stephanou |
| 2017/0040209 A1* | 2/2017 | Wang .................. H01L 21/3226 |
| 2017/0314160 A1* | 11/2017 | Ohno .................... C23C 16/325 |

OTHER PUBLICATIONS

Chandorkar, S. A. et al., "Limits of quality factor in bulk-mode micromechanical resonators," Proc. IEEE Int. Conf. MEMS, 74-77 (2008).
Mehregany, et al. "Silicon carbide MEMS for harsh environments," Proceedings of the IEEE, vol. 86, Issue 8, pp. 1594-1609, Aug. 1998.
Mirgorodsky, et al. "Molecular approach to the modeling of elasticity and piezoelectricity of SiC polytypes," Physical Review B, vol. 52, No. 6, Aug. 1, 1995.
Neudeck, et al., "High-temperature electronics—a role for wide bandgap semiconductors," Proceedings of the IEEE, vol. 90, No. 6, pp. 1065-1076, Jun. 2002.
Perahia, et al.,"Piezoelectric Single Crystal 6H Silicon Carbide Microelectromechanical Resonators," Solid-State Sensors, Actuators and Microsystems Workshop. Hilton Head Island, South Carolina, Jun. 3-7, 2018, pp. 75-78.
Piazza, et al., "Piezoelectric Aluminum Nitride Vibrating Contour-Mode MEMS Resonators," Journal of Microelectromechanical Systems, vol. 15, No. 6, pp. 1406-1418, Dec. 2006.
Svilčić, et al., "Two-Port Piezoelectric Silicon Carbide MEMS Cantilever Resonator," Informacije Midem, Journal of Microelectronics, Electronic Components and Materials, vol. 43, No. 1, pp. 22-26, 2013.
Tabrizian, R. et al.,"Effect of phonon interaction on limiting $f.Q$ product of microelectromechanical resonators," Solid-State Sensors, Actuators and Microsystems Conference, 2009. Transducers 2009. International (4 pages).
Yang, et al., "6H-SiC microdisk torsional resonators in a 'smart-cut' technology," Applied Physics Letters, 104, 091906, 2014.
From U.S. Appl. No. 16/368,802 (now US 2019-0305749 A1), Office Action dated Mar. 10, 2022.

\* cited by examiner

1. Deposit and pattern Etch Stop 165

2. Form bottom electrode 189

3. Deposit PECVD oxide and CMP

4. Bond to oxidized Si handle wafer

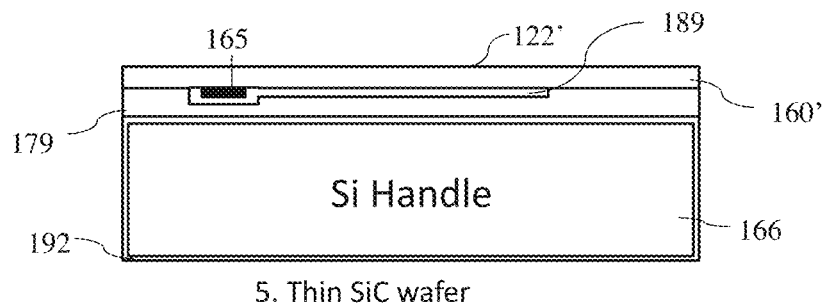
5. Thin SiC wafer
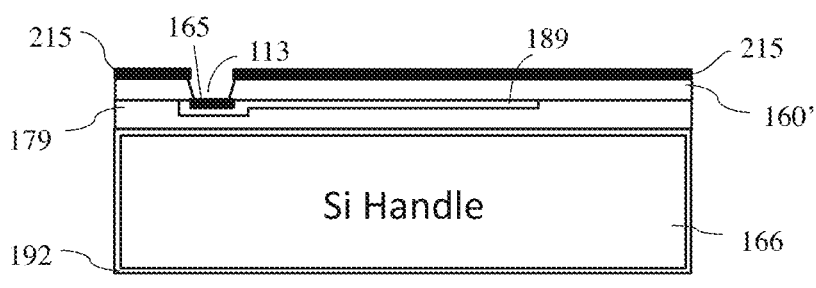
6. Pattern Ni hard mask and etch via
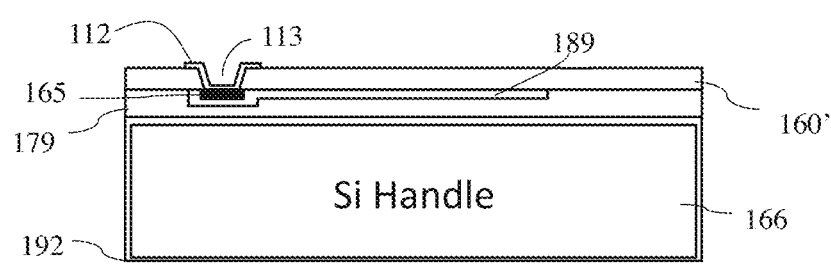
7. Remove Ni hard mask and pattern Via metal
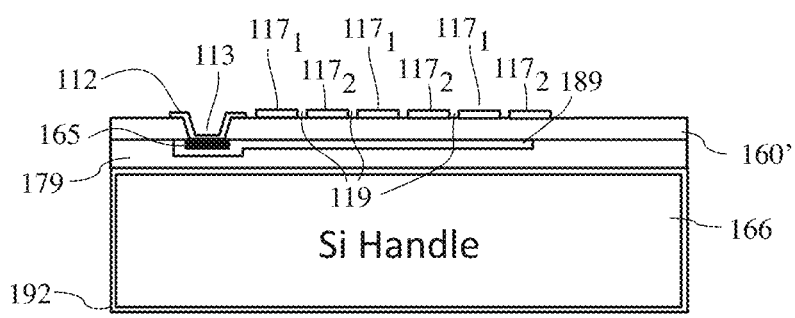
8. Pattern top electrode 117

9. Pattern probe pad

10. Pattern Ni hard mask and etch SiC resonator 128

11. Remove Ni hard mask and HF release

METHOD OF FABRICATING A SIC RESONATOR

CROSS REFERENCE TO RELATED APPLICATIONS

This application is related to and claims the benefit of U.S. Provisional Patent Application Ser. No. 62/651,052 filed on Mar. 30, 2018, U.S. Provisional Patent Application Ser. No. 62/651,046 filed on Mar. 30, 2018, and U.S. Provisional Patent Application Ser. No. 62/656,713 filed on Apr. 12, 2018 which are incorporated herein by reference. This application is also related to U.S. application Ser. No. 16/368,802 filed concurrently herewith and entitled "Piezoelectric Single Crystal Silicon Carbide Microelectromechanical Resonators", the disclosure of which is hereby incorporated herein by reference.

TECHNICAL FIELD

The present writing is directed in general to the field of resonators, and in particular, to the area of single crystalline silicon carbide (SiC) resonators and methods of fabricating ultra-thin embodiments the same. The technology presented herein is applicable to applications and systems that may wish to utilize single crystalline SiC in resonators.

BACKGROUND OF THE DISCLOSURE

SiC microelectromechanical (MEMS) resonators are important components in phononic gyroscope technology (see: U.S. Ser. No. 15/347,748, entitled "Phononic Travelling Wave Gyroscope," filed on Nov. 9, 2016) as well as future radio frequency (RF) technology, among others.

Gyroscope Technology:

Tactical and navigation grade gyroscopes are in great demand by both private and government entities. There are currently both short-term and long-term needs for small MEMS gyroscopes which utilize MEMs resonators. In many applications, a gyroscope can be used to mitigate the number of temporal lapses occurring in onboard navigation systems, whether these lapses are due to GPS denial (i.e. the inability to receive GPS signals) or due to the degradation of other navigation sensors due to environmental or operational effects.

Further, there is currently a need for low-cost, tactical grade MEMS gyroscopes. Yaw sensors are already part of vehicle stabilization systems and software compasses are implemented in high-end vehicle models. A MEMS gyroscope can compensate for the lapses in a GPS signal due to environmental effects and obstructions, enabling navigation capabilities within tunnels, underground structures, multi-tiered parking lots, and urban environments where GPS signals are obstructed.

The government continues to have a need for small and accurate gyroscopes. Applications vary from unmanned aerial vehicle (UAV) navigation systems to underground military applications, including targeting and munitions engineering. The interest of the government is shown by the abundance of current and past programs. Unfortunately, programs have yet to succeed in attaining a navigation grade performance of a MEMS gyroscope in operationally relevant environments. Attaining a navigation grade performance of a MEMS gyroscope may be possible with the technology herein presented.

RF Technology:

The technology herein presented applies to high-performance, on-going RF MEMS technology, including the photonic manipulation of ultra high frequency (UHF) waves which impacts the accuracy, power handling, channel density, and interference of communication, radar, and wireless systems. There is a significant interest in radar, timing, frequency control, and communications applications for this technology. Software programmable radios and communication systems are possible applications for the MEMS photonics technology herein presented. The wafer scaling nature of this technology provides a smooth transition path to a high volume, low-cost production of resonators and equivalents thereof.

RELATED PATENTS

U.S. Pat. No. 6,909,221 entitled "Piezoelectric on Semiconductor-on-Insulator Microelectromechanical Resonators" (Ayazi et al.) describes an embodiment of a piezoelectric resonator wherein a deposition of a piezoelectric layer on top of a substrate layer is needed. The combined piezoelectric/substrate layer herein presented is made of single crystalline 4H or 6H SiC, which is an acoustically low-loss material and results in higher frequency-quality factor products needed for high stability oscillators compared with the nominal piezoelectric-on-semiconductor material layer stack-up.

U.S. Pat. No. 7,791,432 entitled "Contour-Mode Piezoelectric Micromechanical Resonators" (Piazza et al.) describes an embodiment of a resonator wherein a second piezoelectric layer disposed between the interleaved electrode and bottom electrode is used.

Relevant academic literature which is incorporated herein includes:

"Silicon carbide MEMS for harsh environments", M. Mehregany, C. A. Zorman, N. Rajan, and C. H. Wu, Proc. IEEE 86,1594 (1998);

"Two-Port Piezoelectric Silicon Carbide MEMS Cantilever Resonator", B. Svilčić, E. Mastropaolo, R. Cheung, Informacije Midem, Vol. 43, No. 1(2013), 22-26;

"Piezoelectric Aluminum Nitride Vibrating Contour-Mode MEMS Resonators," G. Piazza, P. J. Stephanou and A. P. Pisano, Journal of Microelectromechanical Systems, vol. 15, no. 6, pp. 1406-1418, Dec. 2006;

"6H—SiC microdisk torsional resonators in a "smart-cut" technology", R. Yang, Z. Wang, J. Lee, K. Ladhane, D. J. Yong, P. X.-L. Feng, Applied Physics Letters 104, 091906 (2014);

"High-temperature electronics—a role for wide bandgap semiconductors", P. G. Neudeck, R. S. Okojie, and L.-Y. Chen, Proc. IEEE 90, 1065 (2002).

"Molecular approach to the modeling of elasticity and piezoelectricity of SiC polytypes", A. P. Mirgorodsky and MB/Smirnov, Phys. Rev. B 52, 3993 (1995)

SUMMARY OF THE TECHNOLOGY

The technology herein presented comprises fabrication methods of ultra-thin silicon carbide (SiC) resonators. In accordance with the present disclosure, the SiC resonator is made from a bulk single crystalline SiC wafer (not necessarily a deposited film) which is ground and lapped down to an ultra-thin thickness (<10 µm) to form the body of the SiC resonator. In order to actuate the SiC resonator piezoelectrically, thin metal films are deposited and patterned on opposing sides of the SiC wafer to form top and bottom electrodes. During fabrication, the SiC resonator body is suspended by an interposer film, which comprises a plasma enhanced chemical vapor deposition (PECVD) oxide and a thermal oxide. The combination of these two types of oxide increases a fusion bond strength and quality by limiting the formation of voids during an annealing step which occurs after fusion bonding; this combination also creates a different release speed due to the quality of the two different kinds of oxide. For example, PECVD oxide is less dense than thermal oxide, so PECVD oxide can be etched at a faster rate during the process of aqueous hydrofluoric acid (HF) or HF vapor etching. Hence during fabrication, the resonator can be exposed to aqueous HF or HF vapor for a shorter period of time to reduce any risk of delamination of the thin metal films.

One aspect of this technology enables the designing of ultra-thin SiC resonators that can be actuated piezoelectrically. This technology includes a method comprising the grinding and polishing of a SiC substrate to the ultra-thin thickness, and further, the patterning of an electrode metal on both sides of the SiC resonator body. The fusion bonding process herein presented is designed to limit the formation of voids during the annealing step, which increases a yield of the final resonator device.

BRIEF DESCRIPTION OF THE DRAWINGS

For a more complete understanding of the present disclosure and its features, reference is now made to the following description taken in conjunction with the accompanying drawings, in which like reference numerals represent like parts:

FIGS. 2A-2K illustrate cross-sectional views of various stages in the making of a SiC resonator, such as the embodiment of FIG. 1.

DETAILED DESCRIPTION

Figure 1:
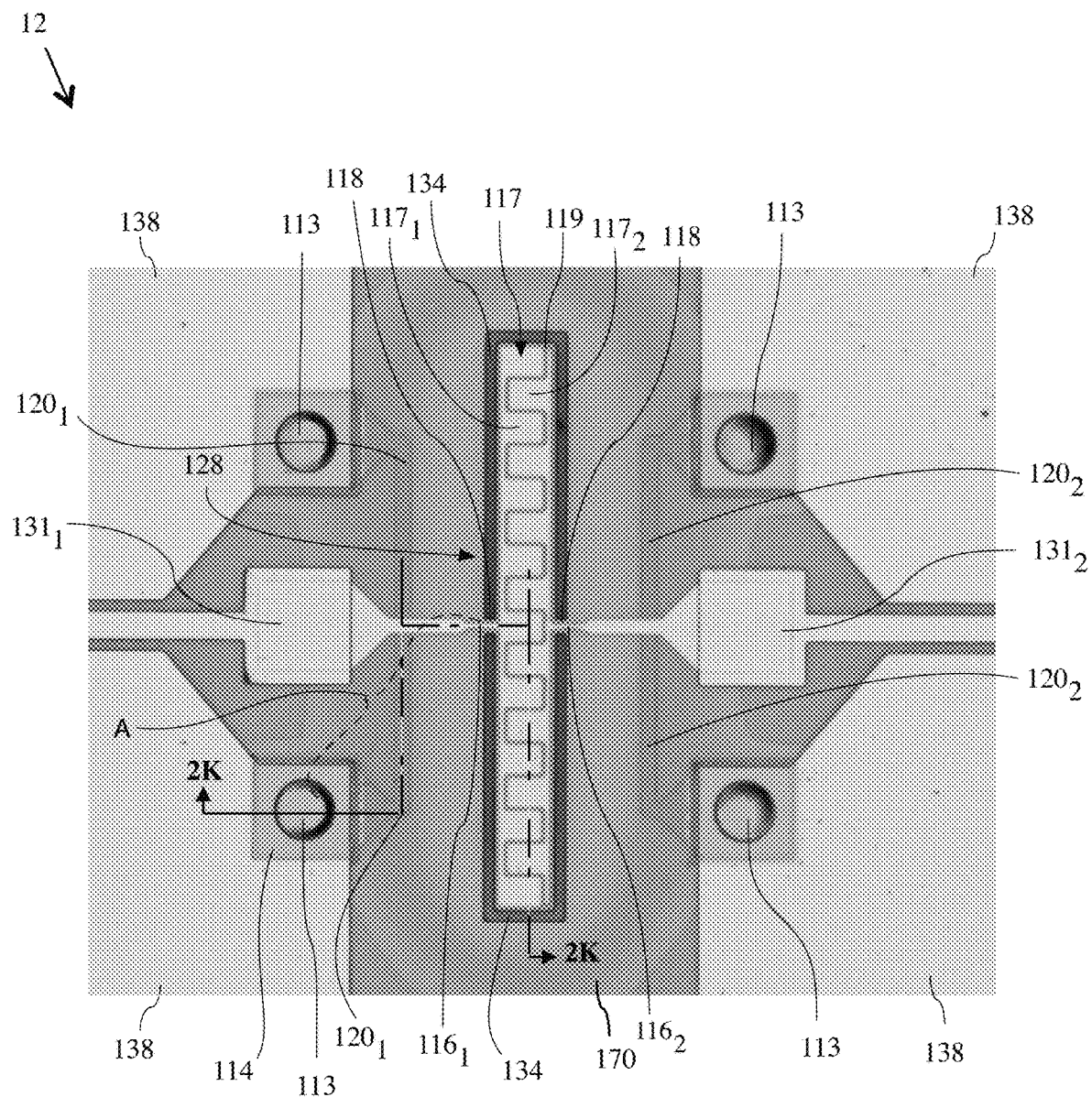
FIG. 1 is a Scanning Electron Micrograph (SEM) a top view of a resonator, according to an embodiment of the technology herein presented.

It should be understood at the outset that, although example embodiments are illustrated below, the present invention may be implemented using any number of techniques, whether currently known or not. The present invention should in no way be limited to the example implementations, drawings, and techniques illustrated below. Additionally, the drawings are not necessarily drawn to scale.

In the following description, certain terminology is used for the purpose of reference only, and is not intended to be limiting. For example, although the terms step 1, step 2, etc., and first, second, etc. may be used herein to describe various elements, methods, or processes, these elements, methods, or processes should not be limited by these terms. These terms are only used to distinguish one element, method, or process from another. As used in the description of the invention and the appended claims, the singular forms "a," "an," and "the" are intended to include the plural forms as well, unless the context clearly indicates otherwise. It will also be understood that the language "and/or" as used herein refers to and encompasses any and all possible combinations of one or more of the associated listed terms. It will be further understood that the terms "comprises" and/or "comprising," when used in this specification, specify the presence of stated features, integers, steps, operations, elements, and/or components, but do not preclude the presence or addition of one or more other features, integers, steps operations, elements, components, and/or groups thereof.

The technology herein presented overcomes barriers which have prevented the fabrication of high quality MEMS resonators out of single crystal (also called crystalline SiC). The present disclosure describes the methods for making the disclosed MEMS resonator out of single-crystalline 4H and 6H SiC wafers. The methods described herein and in the accompanying disclosure (see Appendix A to this application) are different from the "smart-cut" process described in "6H—SiC microdisk torsional resonators in a 'smart-cut' technology" noted above, since the methods herein comprise the addition of metals to the top and bottom surfaces of a piezoelectric SiC layer to form a resonator with driving and sensing electrodes. Further, etching techniques have been developed to address the difficulty involved with etching through a thick SiC layer. In conclusion, barriers which have prevented others from making these MEMS resonators in the past have been overcome.

Appendix A is a pre-publication version of paper which was published after the filing dates of the three provisional patent applications identified above and a copy of the pre-publication version of that paper can be found in U.S. Provisional Patent Application Ser. No. 62/656,713 filed on Apr. 12, 2018 noted above. Appendix A contains additional technical information which may be of use to those who wish to practice the present invention and described the benefits of 6H SiC and describes how 6H SiC can approach or surpass quartz as a desirable material for resonators when supported by narrow tethers. The narrower (and thinner) the tethers the better in terms of isolating the resonator from its environment, but the tethers should to be of sufficient strength to support the resonator from is surrounding frame in use.

Figure 2A:
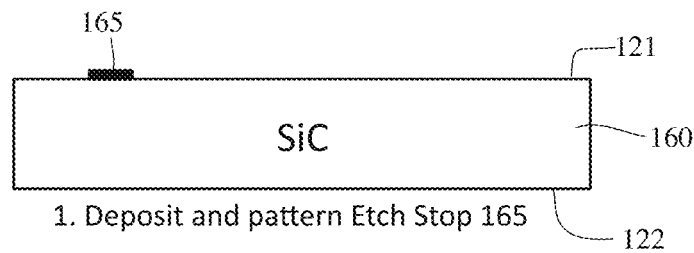
Figure 2B:
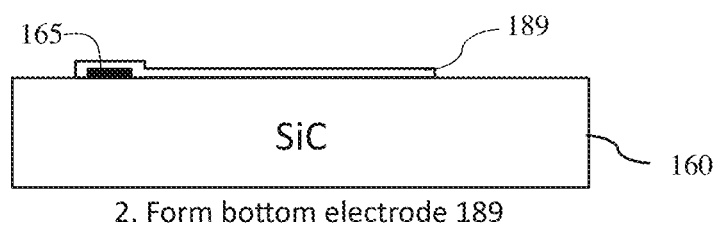
Figure 2C:
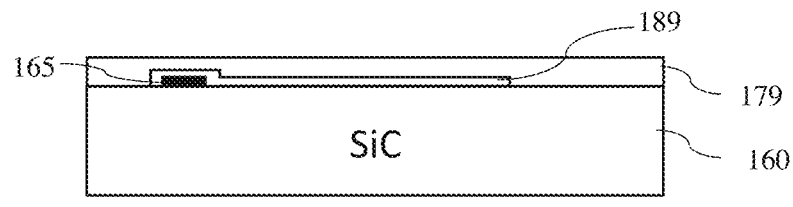
Figure 2D:
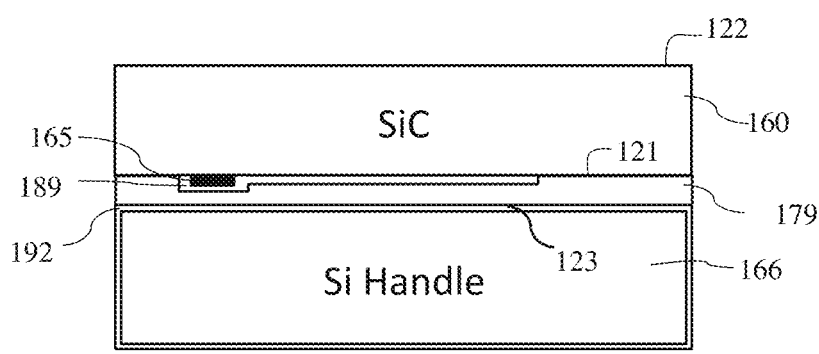
Figure 2I:
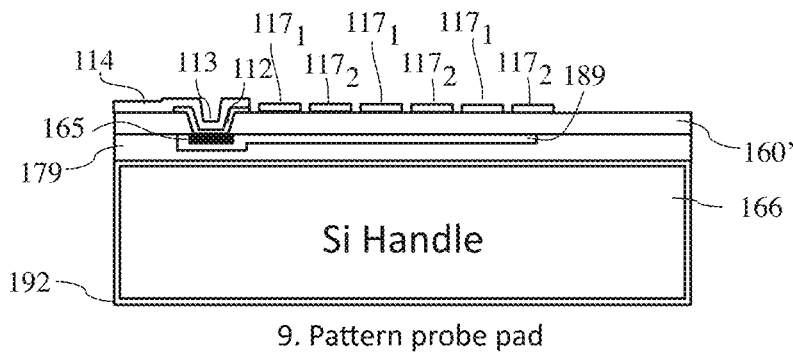
Figure 2J:
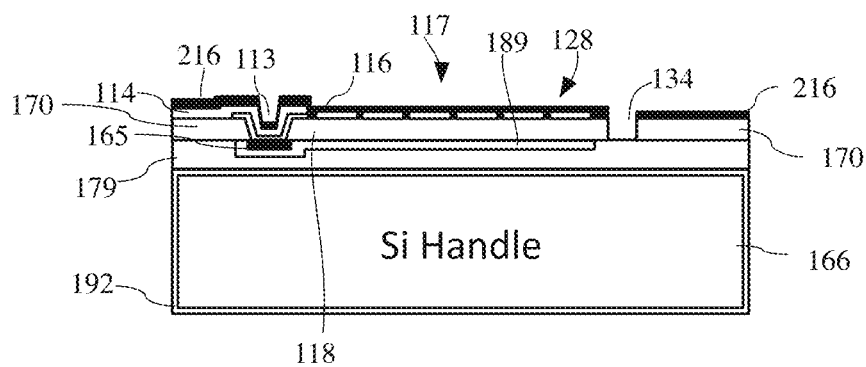
Figure 2K:
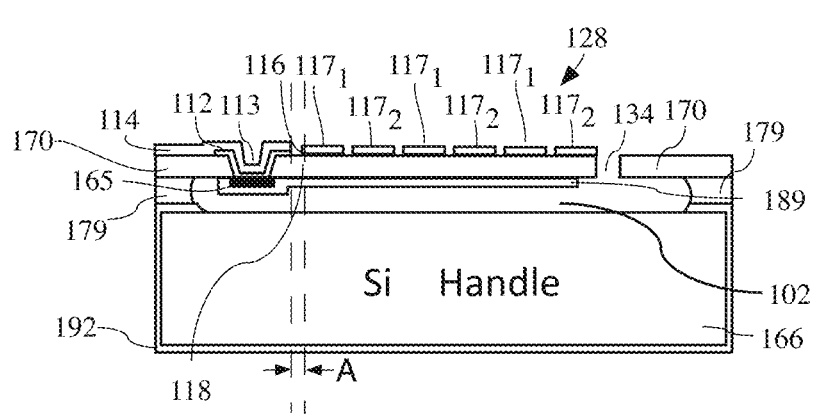

The present invention involves, inter alia, a method for making a resonator 12 according to embodiments of the present invention will now be described with reference to FIGS. 1 and 2A-2K. FIG. 1 illustrates a top view of a SiC resonator 12 having a top electrode 117 which is divided into two portions $177_1$ and $177_2$ which is disposed on a thinned body of SiC 160' (see FIG. 2H for example). The two portions $177_1$ and $177_2$ are ohmically isolated from each other by a narrow serpentine path or gap 119 which separates the two portions $177_1$ and $177_2$ and exposes the resonator SiC body 128 below. Each portion $177_1$ and $177_2$ is connected to a respective RF port $131_1$ or $131_2$. by metallic traces $116_1$ and $116_2$. The the portions $177_1$ and $177_2$ are preferably defined into a series interdigitated relatively wide (compared to the width of path 119) fingers by the narrow serpentine path or gap 119. The portions $177_1$ and $177_2$ are disposed on a major surface of the thinned body of SiC 160' (see FIG. 2H for example) and over (and ohmically isolated from) a bottom electrode 189 disposed on an opposing major surface of the thinned body of SiC 160'. The bottom electrode 189 is not shown on FIG. 1, but is shown on FIGS. 2A-2K, and preferably has the same overall dimensions (length and width) as top electrode 117. Metallized vias 113 are provided one or more of which is coupled with the bottom electrode 189. The two portions $177_1$ and $177_2$ of the top electrode 117, the bottom electrode 189 and the thinned body of SiC 160' disposed there between define a SiC resonator body 128 which is supported by SiC tethers 118 to a surrounding frame 170 of SiC. The frame 170 is spaced (by a gap 134) from a majority of the thinned body of SiC 160' of resonator 12 except where the frame 170 couples with the thinned body of SiC 160' of resonator 12 at tethers 118. Numeral 138 points to optional ground pads. These elements and the interrelationships will become clearer as the following descriptions of FIGS. 2A and 2K is presented. These elements are formed on or supported by a thinned SiC wafer 160', which cannot be directly seen in FIG. 1, but which does appear in FIGS. 2A through 2K.

An exemplary process for making resonator 12 is described below with reference to FIGS. 2A-2K. This process comprises various stages, many of which involve a number of semiconductor fabrication steps which should be individually understood by those skilled in the art of semiconductor fabrication and therefor are not described in detail for brevity's sake. FIGS. 2A-2K re depicted as cross sectional views following a dashed line 2K-2K seen on FIG. 1. There are portions of the cross sectional views which are omitted since there are unnecessary to an understanding of the present disclosure of a ultra thin SiC resonator.

The first stage comprises patterning an etch stop 165 (preferably formed of chromium/nickel or Cr/Ni, and preferably deposited in that order) using, for example, a metal liftoff process performed on a backside 121 of a relatively thick SiC wafer 160. SiC wafer 160 is relatively thick compared to its thickness after thinning (compare FIGS. 2D and 2E) where it is identified with the label 160' to differentiate from the relatively thick version 160 thereof.

The next stage (see FIG. 2B) comprises patterning bottom electrode 189 (preferably formed of chromium/gold or Cr/Au, and preferably deposited in that order) on the etch stop 165 and on the backside 121 of the SiC wafer 160 using, for example, a metal liftoff process. A third stage (see FIG. 2C) involves (i) depositing a PECVD oxide 179 on the exposed portions of the backside 121 and also covering electrode 189 and any portion of etch stop 165 not already covered by electrode 189 and (ii) flattening (if needed) the oxide 179. The flattening of oxide 179 may comprise planarizing the exposed major surface (surface topography) of the PECVD oxide 179 by using, for example, a chemical mechanical polishing (CMP) process so that the exposed major surface of the PECVD oxide 179 is smooth.

At the next stage (see FIG. 2D), a Si handle layer 166 is thermally oxidized to form a thin thermal oxide layer 192 on its exterior surface, and then it is fusion bonded with the oxide 179 on the patterned SiC wafer 160. The thermal oxidation of the Si handle wafer 166 to form a thermal oxide layer 192 on its exposed surfaces is performed to improve the strength and quality of the bond of the oxide layer 192 to oxide 179 bond formed during the fusion bonding by preventing and/or reducing the formation of voids or unbonded surfaces in the bond between oxide layer 192 and oxide 179. Materials other than Si may be used for handle layer 166 if desired. The SiC wafer 160 is depicted as having been flipped over in FIG. 2D.

After flipping (see FIG. 2D) the frontside 122 of the SiC wafer 160 is now easily accessible during stage five which comprises thinning down the SiC wafer 160 to a desired SiC resonator thickness to form an ultra-thin SiC wafer 160' with a frontside 122', as shown in FIG. 2E. The thinning down the SiC wafer 160 can be done by mechanical lapping, grinding, and polishing the SiC wafer 160, for example. As previously mentioned, it is desirable to prevent or reduce the formation of voids or unbonded surfaces between the oxide layer 192 to oxide 179 bond and that in turn reduces the possibility of SiC layer 160' delaminating during the aforementioned thinning of the SiC layer 160'. The final thickness of the thinned SiC layer 160' may be, for example, 3.5 µm, which is certainly ultra-thin compared to the prior art. The thinness of SiC layer 160' in embodiments desirable for those practicing this invention will depend on the desired frequency of operation of the resonator 12 as well the user's skill in inhibiting delaminating during the aforementioned thinning of the SiC layer 160' by providing a void free bond between the oxide layer 192 and oxide 179.

During the next stage (see FIG. 2F), a Ni hard mask 215 is patterned on the frontside 122' of the SiC wafer 160' preferably using a metal liftoff process, and a SiC via 113 is etched in areas of the SiC wafer 160' not covered by the Ni hard mask 215. The SiC via 113 is etched preferably using a Versaline® Reactive Ion Etching (ME) system. Additional vias 113 (see FIG. 1) may be formed at the same time. The Ni hard mask 215 is then removed, for example, by wet etching.

During the following stage (see FIG. 2G) via metal 112 is formed in via 113 by depositing via metal 112 (preferably made of chromium/nickel/gold or Cr/Ni/Au and preferably deposited in that order). While the SiC wafer160' and Si handle 166 is under vacuum in a metal deposition tool, an ionized Ar beam is preferably turned on, with the intent of removing any native oxide or any residues, before metal deposition in via 113. This in-situ ion-milling cleaning operation is desirable to ensure good electrical conductivity between the bottom metal electrode 189 (and etch stop 165) and via metal 112.

During the next stage (see FIG. 2H), a thin, top electrode 117 (preferably made. made of chromium/gold or Cr/Au, and preferably deposited in that order) is patterned on the frontside 122' of the SiC wafer 160' to define its fingers formed by the two portions $177_1$ and $177_2$ thereof depicted in FIG. 1. The fingers of the two portions $177_1$ and $177_2$ are separated from neighboring fingers by gap 119 which exposes the resonator body 128 below. The top electrode 117 is patterned preferably via a metal liftoff process. During the following stage (see FIG. 2I), a probe pad 114 (preferably made of chromium/gold or Cr/Au, and preferably deposited in that order) is patterned, preferably via a metal liftoff process, on the metallized via 113 and part of the frontside 122' of the SiC wafer 160'. The probe pad 114 is an electrical interface for wire bonding and for connecting to the bottom metal electrode 189. The ground pad 138 seen in the lower lefthand corner of FIG. 1 corresponds to or is to coupled with to the probe pad 114. The signal pads $131_1$ and $131_2$ seen in FIG. 1 can also be patterned on the frontside 122' of the SiC wafer 160' during stage 9 though this is not shown in FIG. 2I. Preferably, the signal pads signal pads $131_1$ and $131_2$ are ohmically isolated from the ground pads 138.

During the next stage (see FIG. 2J) a Ni hard mask 216 is patterned, preferably via a metal liftoff process, on the exposed electrode 117 portions $117_1$ and $117_2$, the probe pad 114, and the SiC wafer 160'. This stage further involves etching the region of the SiC wafer 160' not covered by the Ni hard mask 216 to form a resonator body 128, tethers 118 (see also FIG. 1), and a SiC layer/frame 170 from the thinned SiC wafer 160', wherein the tethers 118 connect the SiC frame 170 to the resonator body 128 as is more clearly depicted by FIG. 1. The tethers 118 are defined from the body of the thinned SiC wafer 160' material when the gaps 134 are etched away. The gaps 134 can also be referred to as trenches which are defined by the PECVD oxide 179, the frame 170, and the resonator body 128.

FIG. 2K illustrates a cross sectional view of the resonator 12 taken along line 2K-2K of FIG. 1 after stage 11 processing has be accomplished. FIGS. 2A-2K depict the via 113 as being rather close to electrode 117 portions $117_1$ and $117_2$ whereas in the SEM of FIG. 1 shows greater separation. The section line 2K-2K of FIG. 1 has a portion thereof identified by a broken line brace A which is compacted compared to the views of FIG. 2A-2K . . . in FIG. 2K the space between the two dashed lines labeled A more or less correspond to the space defined by broken line brace A of FIG. 1.

Stage 11 (see FIG. 2K) comprises releasing the resonator body 128, removing the Ni hard mask 216 preferably via wet etching the Ni hard mask 216. Stage 11 further comprises forming a gap 102 between the resonator body 128 and the SiC layer 170, which can comprise etching regions of the oxide layers 179 and 192 between the resonator body 128 and the SiC layer 170 with aqueous HF or HF vapor, and etching areas of the oxide layers 179 and 192 between the resonator body 128 and the Si handle layer 166 with aqueous HF or HF vapor, wherein the aqueous HF is preferably a mixture of one part of 49% aqueous HF acid mixed with four parts of deionized water).

A metal liftoff process as the term is used herein refers to a liftoff process that uses a metal as the target material. A metal liftoff process can comprise: providing a substrate; depositing a sacrificial stencil layer (e.g. a photoresist) on the substrate; removing regions of the sacrificial stencil layer where the target material (e.g. metal) is to be located (e.g. 1) by exposing regions of the photoresist where the target material is not to be located and developing the photoresist or 2) by exposing regions of the photoresist where the target material is not to be located, diffusing amine vapors through the photoresist, exposing the photoresist to UV light, and developing the photoresist), thereby uncovering regions of the substrate; depositing the target material on the sacrificial stencil layer and on the uncovered regions of the substrate; removing and/or washing away the remaining sacrificial stencil layer along with the regions of the target material covering parts of the remaining sacrificial stencil layer.

At stage 1 (see FIG. 2A), patterning the etch stop 165 via the metal liftoff process performed on the backside 121 of the SiC wafer 160 can comprise: depositing a sacrificial stencil layer (e.g. photoresist) on the backside 121 of the SiC wafer 160; removing regions of the sacrificial stencil layer where the etch stop 165 is to be located, thereby uncovering regions of the SiC wafer 160; depositing the Cr/Ni that preferably form the etch stop 165 on the sacrificial stencil layer and on the uncovered regions of the SiC wafer 160; removing and/or washing away the remaining sacrificial stencil layer along with the regions of the Cr/Ni covering parts of the remaining sacrificial stencil layer.

At stage 2 (see FIG. 2B), patterning the bottom electrode 189 on etch stop 165 and on the backside 121 of the SiC wafer 160 via a metal liftoff process can comprise: depositing a sacrificial stencil layer (e.g. photoresist) on the etch stop 165 and on the backside 121 of the SiC wafer 160; removing regions of the sacrificial stencil layer where the bottom electrode 189 is to be located, thereby exposing regions of the SiC wafer 160 and the etch stop 165; depositing the Cr/Au that preferably form the bottom electrode 189 on the sacrificial stencil layer and on the exposed regions of the SiC wafer 160 and the etch stop 165; removing and/or washing away the remaining sacrificial stencil layer along with the regions of the Cr/Au covering parts of the remaining sacrificial stencil layer.

At stage 3 (see FIG. 2C), depositing the PECVD oxide 179 on the bottom electrode 189 and on the backside 121 of SiC wafer 160 can comprise depositing the PECVD oxide 179 via a PECVD of the PECVD oxide179, which can comprise: providing a chamber; providing a ground electrode and a radio frequency (RF) driven electrode inside the chamber; placing the SiC wafer 160 frontside 122 down on the grounded electrode; heating the SiC wafer 160 to an elevated temperature (e.g. 250° C. to 350° C.); inserting a silicon precursor (e.g. gaseous silane or $SiH_4$) into the chamber; inserting an oxygen precursor (e.g. nitrous oxide or $N_2O$) into the chamber; applying a high power (e.g. 20 W to 260 W) RF signal to the RF driven electrode to create a plasma of the silicon and oxygen precursors, wherein a chemical reaction resulting from the creation of the plasma forms a reaction product which is deposited or precipitated as PECVD oxide 179 on the bottom electrode 189 and on the backside 121 of SiC wafer 160. In at least one embodiment depositing the PECVD oxide 179 can be performed by using a PlasmaPro 80 PECVD, which is a system manufactured by Oxford Instruments plc.

Also at stage 3, the CMP process can comprise: providing a plate; providing a polishing pad disposed on and attached to the plate; providing a carrier; placing the SiC wafer 160 backside 121 down on the polishing pad and placing the SiC wafer 160 below the carrier; providing a slurry (e.g. klebosol) on the polishing pad; providing a downward force to the carrier and rotating the carrier so as to rotate the SiC wafer 160 about a first axis; rotating the plate about a second axis so as to also rotate the polishing pad, thereby polishing or planarizing the SiC wafer 160; providing a conditioning pad; providing a downward force to the conditioning pad so that the conditioning pad planarizes the polishing pad.

At stage 4 (see FIG. 2D), fusion bonding the patterned SiC wafer 160 to a thermally oxidized Si handle wafer 166 can comprise: cleaning the SiC wafer 160 and the oxidized Si handle wafer 166 with a piranha solution (a mixture of sulfuric acid $H_2SO_4$ and hydrogen peroxide $H_2O_2$) and a Radio Corporation of America (RCA) solution (a mixture of deionized water, ammonia and hydrogen peroxide); activating the bond surfaces (backside 121 of SiC wafer 160 and frontside 123 of Si handle wafer 166) in a low pressure $O_2$ or $N_2$ plasma chamber to make hydrophilic surfaces on the frontside 123 of the Si handle wafer and on the backside 121 of the SiC wafer; placing the SiC wafer 160 backside 121 down on the frontside 123 of the oxidized Si handle wafer 166; forcing the SiC wafer 160 and the Si handle wafer 166 together and forming an intimate contact between their surfaces; annealing the SiC wafer 160 and the Si handle wafer 166 at an elevated temperature to achieve a high bond energy and bond strength.

At stage 5 (see FIG. 2E) care should be taken in the thinning process describe above to help ensure that the SiC does not delaminate.

At stage 6 (see FIG. 2F), patterning the Ni hard mask 215 via the metal liftoff process performed on the frontside 122' of the SiC wafer 160' may comprise: depositing a sacrificial stencil layer (e.g. photoresist) on the frontside 122' of the SiC wafer 160' and on the region of the SiC wafer 160' wherein the via 113 is to be located; removing regions of the sacrificial stencil layer where the Ni hard mask 215 is to be located (i.e. regions where via 113 is not to be located), thereby uncovering regions of the SiC wafer 160'; depositing the Ni that forms the Ni hard mask 215 on the sacrificial stencil layer and on the uncovered regions of the SiC wafer 160'; removing and/or washing away the remaining sacrificial stencil layer along with the regions of the Ni hard mask 215 covering parts of the remaining sacrificial stencil layer to uncover the region of the SiC layer 160' where the via 113 is to be located.

During stage 6, the hard mask 215 can instead be made of a photoresist material, aluminum, copper, or chrome. The hard mask 215 is preferably made of nickel which is preferable due to the small feature size of the via 113 in the SiC wafer 160'. Nickel has the best selectivity to SiC when compared to other hard mask materials because a thickness of Nickel necessary to etch a first amount of SiC is generally thinner than the necessary thickness of other mask materials to etch the same amount of SiC.

At stage 7 (See FIG. 2G), wet etching the Ni hard mask 215 can comprise wet etching the Ni hard mask 215 with a wet etchant, wherein the wet etchant is Nickel Etchant Type I, as produced by Transene Company, Inc. The planetary deposition process of the via metal 112 in step 7 is a metal deposition process which enables good coverage of the via 113, wherein the via metal 112 preferably fills the walls of the via 113, wherein filling the walls can comprise covering the walls of the via 113. The in situ ion-milling cleaning of the via 113 is performed preferably while the SiC wafer 160' is in a vacuum, and before the step of depositing the via metal 112. In situ ion-milling cleaning of the via 113 can comprise directing a beam of ionized argon (Ar) toward the via 113, thereby removing any native oxide or any residues within the via 113, and this is followed by the depositing of the via metal 112.

At stage 8 (see FIG. 2H), patterning the thin, top electrode 117 via the metal liftoff process can comprise: depositing a sacrificial stencil layer (e.g. photoresist) on the frontside 122' of the SiC wafer 160'; removing regions of the sacrificial stencil layer where the top electrode 117 is to be located, thereby uncovering regions of the SiC wafer 160'; depositing the Cr/Au that forms the top electrode 117 on the sacrificial stencil layer and on the uncovered regions of the SiC wafer 160'; removing and/or washing away the remaining sacrificial stencil layer along with the regions of the top electrode 117 covering parts of the remaining sacrificial stencil layer.

Stage 8 can further comprise patterning first traces $116_1$ and $116_2$ on the frontside 122' of the SiC wafer 160' via a metal liftoff process, by the first traces $116_1$ and $116_2$ are located on the topsides of the tethers 118 after step 10. Stage 2 can further comprise patterning second traces 120 (see FIG. 1) on the back side 121 of the SiC wafer 160 via a metal liftoff process during stage 2, wherein the second traces (from the bottom electrode 189) are also located below the tethers 118 after they are formed. The first traces $116_1$ and $116_2$ electrically connect the two portions of top electrode 117 to the signal pads $131_1$ and $131_2$ via the top sides of the tethers 118. The second 120 traces electrically connect the bottom electrode 189 to the metallized vias 113 via the bottom sides of the tethers 118.

At stage 11, wet etching the Ni hard mask 216 can comprise wet etching the Ni hard mask 216 with a wet etchant, wherein the wet etchant is Nickel Etchant Type I, as produced by Transene Company, Inc. The top electrode portions $117_1$ and $117_2$ can comprise first can second top electrodes, wherein the first top electrode has fingers or protrusions interleaved or interdigitated between the figure or protrusions second top electrode, as can be seen in FIG. 1. The first top electrodes $117_1$ can be utilized as driving electrodes and the second top electrodes $117_2$ can be utilized as sensing electrodes or visa versa.

The PECVD oxide 179 is preferably silicon dioxide ($SiO_2$) and the thermal oxide of thermal oxide layer 192 is preferably $SiO_2$.

The SiC wafer 160 is preferably formed of 6H SiC for reasons set forth in Appendix A.

Modifications, additions, or omissions may be made to the systems, apparatuses, and methods described herein without departing from the scope of the proposed technology. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this presentation with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this presentation is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for making a resonator comprising:
providing a silicon carbide wafer having a first side and a second side;
forming a first electrode on the first side of the silicon carbide wafer;
forming a first oxide on the first electrode and the first side of the silicon carbide wafer;
providing an oxidized silicon handle wafer having a surface made of a second oxide;
forming a bond between the first and second oxides, thereby bonding the silicon carbide wafer to the silicon handle wafer;
forming a second electrode on the second side of the silicon carbide wafer;
forming a resonator body, a frame, and tethers from the silicon carbide wafer;
releasing the resonator body by removing at least part of the first oxide; and
wherein the resonator body has a first side opposite a second side, and wherein the first electrode is on the first side of the resonator body, and wherein the second electrode is on the second side of the resonator body.

2. The method of claim 1, wherein the step of releasing the resonator body comprises:
etching trenches into the second side of the silicon carbide wafer to expose the first oxide.

3. The method of claim 1, wherein the step of forming the first oxide further comprises:
- covering the first electrode with the first oxide; and
- chemical mechanical polishing a surface of the first oxide to form a polished surface of the first oxide.

4. A method for making a resonator comprising:
- providing a silicon carbide wafer having a first side and a second side;
- forming a first electrode on the first side of the silicon carbide wafer;
- forming a first oxide on the first electrode and the first side of the silicon carbide wafer;
- providing an oxidized silicon handle wafer having a surface made of a second oxide;
- forming a bond between the first and second oxides, thereby bonding the silicon carbide wafer to the silicon handle wafer;
- forming a second electrode on the second side of the silicon carbide wafer, the silicon carbide wafer being thinned before forming the second electrode;
- forming a resonator body, a frame, and tethers from the silicon carbide wafer;
- releasing the resonator body by removing at least part of the first oxide.

5. The method of claim 4, wherein the step of thinning the silicon carbide wafer comprises:
- lapping and polishing the silicon carbide wafer.

6. A method for making a resonator comprising:
- providing a silicon carbide wafer having a first side and a second side;
- forming a first electrode on the first side of the silicon carbide wafer;
- forming a first oxide on the first electrode and the first side of the silicon carbide wafer;
- providing an oxidized silicon handle wafer having a surface made of a second oxide;
- forming a bond between the first and second oxides, thereby bonding the silicon carbide wafer to the silicon handle wafer;
- forming a second electrode on the second side of the silicon carbide wafer;
- forming a resonator body, a frame, and tethers from the silicon carbide wafer;
- releasing the resonator body by removing at least part of the first oxide;
- forming an etch stop on the first side of the silicon carbide wafer before the step of forming the first electrode,
- wherein the step of forming the first electrode comprises:
- forming the first electrode on the etch stop and the first side of the silicon carbide wafer.

7. The method of claim 6, further comprising:
- forming a metallized via in the silicon carbide wafer from the first side of the silicon carbide wafer to the etch stop, wherein the metallized via is electrically connected to the etch stop, and wherein the etch stop is electrically connected to the first electrode.

8. The method of claim 1, wherein the second electrode comprises first top electrodes and second top electrodes, wherein the first top electrodes are interleaved between the second top electrodes.

9. The method of claim 1, wherein the first side is opposite the second side.

10. The method of claim 4, wherein the resonator body has a first side opposite a second side, and wherein the first electrode is on the first side of the resonator body, and wherein the second electrode is on the second side of the resonator body.

11. The method of claim 1, wherein the step of forming the first oxide comprises depositing the first oxide via a plasma enhanced chemical vapor deposition of the first oxide.

12. The method of claim 11, further comprising planarizing a surface of the first oxide before the step of forming the bond.

13. The method of claim 4, wherein the step of thinning the silicon carbide wafer comprises thinning the silicon carbide wafer to a thickness of less than 10 micrometers.

14. The method of claim 1, wherein the first oxide comprises silicon dioxide, and wherein the second oxide comprises silicon dioxide.

15. The method of claim 1, wherein the step of forming the resonator body, the frame, and the tethers comprises etching into the second side of the silicon carbide wafer to the first oxide.

16. The method of claim 1, wherein the step of releasing the resonator body comprises etching at least part of the first oxide located between the resonator body and the silicon wafer.

17. The method of claim 3, wherein the step of forming the bond between the first and second oxides comprises forming the bond between the polished surface of the first oxide and the second oxide.

18. A method for making a resonator comprising:
- providing a silicon carbide wafer having a first side and a second side;
- forming a first electrode on the first side of the silicon carbide wafer;
- forming a first oxide on the first electrode and the first side of the silicon carbide wafer;
- providing an oxidized silicon handle wafer having a surface made of a second oxide;
- forming a bond between the first and second oxides, thereby bonding the silicon carbide wafer to the silicon handle wafer;
- forming a second electrode on the second side of the silicon carbide wafer;
- forming a resonator body, a frame, and tethers from the silicon carbide wafer;
- releasing the resonator body by removing at least part of the first oxide; and
- wherein the silicon carbide wafer is a 4H or 6H silicon carbide wafer.

19. The method of claim 18, wherein the silicon carbide wafer is a 6H silicon carbide wafer.

* * * * *